(12) United States Patent
Xue et al.

(10) Patent No.: US 12,181,548 B2
(45) Date of Patent: Dec. 31, 2024

(54) ADAPTIVE DAMPING MAGNETIC FIELD SENSOR

(71) Applicant: Guoqiang Xue, Beijing (CN)

(72) Inventors: Guoqiang Xue, Beijing (CN); Zhi Geng, Beijing (CN); Xin Wu, Beijing (CN)

(*) Notice: Subject to any disclaimer, the term of this patent is extended or adjusted under 35 U.S.C. 154(b) by 20 days.

(21) Appl. No.: 17/461,943

(22) Filed: Aug. 30, 2021

(65) Prior Publication Data

US 2023/0069682 A1     Mar. 2, 2023

(51) Int. Cl.
    *G01V 3/10*     (2006.01)
    *G01R 33/385*     (2006.01)
    *G01V 3/40*     (2006.01)

(52) U.S. Cl.
    CPC ............ *G01R 33/3854* (2013.01); *G01V 3/10* (2013.01); *G01V 3/40* (2013.01)

(58) Field of Classification Search
    CPC ......... G01R 33/3854; G01V 3/10; G01V 3/40
    See application file for complete search history.

(56) References Cited

U.S. PATENT DOCUMENTS

| | | | |
|---|---|---|---|
| 2006/0006872 A1* | 1/2006 | Nelson | G01V 3/104 324/327 |
| 2013/0119992 A1* | 5/2013 | Bailey | G01V 3/101 324/326 |

FOREIGN PATENT DOCUMENTS

CN     207440309 U    *    6/2018

OTHER PUBLICATIONS

How does Digital Potentiometers work, why and where should you use them?, Jan. 28, 2020, available at https://components101.com/articles/how-digital-potentiometer-works-and-how-to-use-it. (Year: 2020).*

* cited by examiner

*Primary Examiner* — Daniel R Miller

(57) ABSTRACT

This application provides an adaptive damping magnetic field sensor, including: a receiving coil, an adaptive damping matching resistance circuit, and an amplifying circuit; where the receiving coil is used for receiving an earth response signal generated by the earth under excitation of an emission source, and generating an induced voltage; the adaptive damping matching resistance circuit is used for receiving the induced voltage generated by the receiving coil and automatically matching a damping resistance value to obtain a near-source broadband observation signal; and the amplifying circuit is used for amplifying the observation signal with a constant gain and outputting a sensor output signal. This application carries out automatic matching control on the damping resistance value through the adaptive damping matching resistance circuit, thereby ensuring that the sensor can stably and reliably implement fine observation of an earth response under near-source, broadband and complex scene conditions.

6 Claims, 3 Drawing Sheets

Receiving coil module    Amplified output module

ADAPTIVE DAMPING MAGNETIC FIELD SENSOR

TECHNICAL FIELD

The present disclosure relates to the field of geophysical prospecting, and in particular, to an adaptive damping magnetic field sensor.

BACKGROUND ART

An electromagnetic method is a geophysical survey method based on the principles of electromagnetic induction. The electromagnetic method explores spatial distribution and physical characteristics of subsurface structures by observing a response generated by the earth under excitation of a natural or artificial electromagnetic field source. The electromagnetic method is one of core methods to carry out exploration of mineral resources.

A traditional electromagnetic survey method based on a long ground wire source (as shown in FIG. 1) usually carries out observation under a far-source area condition. A distance between an observation point and an emission source is relatively large. A transceiving distance is greater than 4-6 times of an intended exploration depth. Since an amplitude and bandwidth of a response signal decrease rapidly with an increase in the transceiving distance, a resolution capability of the electromagnetic survey method is reduced.

In recent years, a novel method based on a near-source observation mode (as shown in FIG. 2) has emerged, which extends a distance between an observation point and a source from 4-6 times greater than an intended exploration depth to a range of 0.3-2 times of the intended exploration depth. According to theoretical demonstrations, in the near-source observation mode, signals are stronger, a bandwidth is greater, and a greater exploration depth can be reached. In addition, a higher resolution capability is achieved, and the volume effect is further reduced.

An equivalent circuit of a traditional inductive magnetic field sensor is shown in FIG. 3, mainly including two parts: a receiving coil module and an amplifying circuit module; where $V_s$ is an induced voltage generated when a receiving coil receives a response signal, L is a coil equivalent inductance, r is a coil internal resistance, C is a coil distributed capacitance, and $R_t$ is a matching damping resistance. It can be seen that in the traditional sensor, a matching damping resistance is a fixed single value.

However, when a near-source observation is carried out, a signal-of-interest bandwidth is relatively increased, $\omega/\omega_n$ ($\omega$ is a circular frequency, and co n is a non-damping natural attenuation frequency) is relatively large, and its variation range will become very large as earth resistivity conditions change, resulting in a very large gap between zero error damping coefficients of an amplitude and a phase. Consequently, selection of a single damping coefficient becomes very difficult, an applicable range is smaller, and strong oscillations of a collected signal are more likely to occur in an early stage of a signal. A small bandwidth damping coefficient of the traditional far-source electromagnetic sensor cannot be matched with a near-source large bandwidth.

In conclusion, during the observation by a near-source electromagnetic method, a resonant frequency, a damping coefficient and a noise level of a magnetic field sensor are mutually restricted. The requirements of the observation by the near-source electromagnetic method can no longer be met by the use of a single matching damping resistance value.

SUMMARY OF THE INVENTION

A technical problem to be solved by the present disclosure is that when a traditional sensor with only a single damping value in a near-source mode is used for different exploration scenes, early signals are prone to oscillations. The present disclosure provides an adaptive damping magnetic field sensor.

To achieve the foregoing objective of the disclosure, the present disclosure employs a technical solution below.

An adaptive damping magnetic field sensor includes:
a receiving coil, an adaptive damping matching resistance circuit, and an amplifying circuit; where the receiving coil is used for receiving an earth response signal generated by the earth under excitation of an emission source, and generating an induced voltage;
the adaptive damping matching resistance circuit is used for receiving the induced voltage generated by the receiving coil and automatically matching a damping resistance value to obtain a near-source broadband observation signal; and
the amplifying circuit is used for amplifying the observation signal with a constant gain and outputting a sensor output signal.

Preferably, the adaptive damping matching resistance circuit includes: a damping feedback circuit, a damping adjustment microcontroller, and a programmable resistor; where
the damping feedback circuit collects an input voltage of the amplifying circuit, a feedback signal that is output is connected to the damping adjustment microcontroller, the feedback signal is adjusted by the damping adjustment microcontroller to form a control signal of the programmable resistor, an output of the damping adjustment microcontroller transmits the control signal to the programmable resistor through a serial bus, the programmable resistor adjusts and outputs a matching damping resistance value after receiving the control signal transmitted through the serial bus, and multiple iterations are performed to obtain a damping coefficient.

Preferably, the receiving coil includes: an equivalent inductance, a coil internal resistance, and a distributed capacitance; where
the equivalent inductance, the coil internal resistance, the distributed capacitance, and a response voltage of the receiving coil are connected in series, the induced voltage output by the receiving coil is a voltage at both ends of the equivalent inductance, and the equivalent capacitance is connected with the adaptive damping matching resistance circuit in parallel.

Preferably, that the feedback signal is adjusted by the damping adjustment microcontroller to form the control signal of the programmable resistor includes:
the damping adjustment microcontroller analyzes characteristics of the feedback signal, and uses a deviation from a linear time-invariant condition to an amplitude and phase of a transfer function in formulas below as a linear error quantization function, to analyze a distortion degree of the amplitude and a distortion degree of the phase;

$$error_A(\omega) = \frac{A(\omega) - A(\omega)_{\omega \to 0}}{A(\omega)_{\omega \to 0}} = \frac{\omega_n^2}{\sqrt{(\omega_n^2 - \omega^2)^2 + (2\xi\omega_n\omega)}} - 1$$

$$error_\phi(\omega) = \phi(\omega) - \phi(\omega)_{\omega \to 0} = -\arctan\frac{2\xi\omega_n\omega}{\omega_n^2 - \omega^2} + 2\xi\frac{\omega}{\omega_n}$$

where $$\alpha = \frac{R_t}{R_t + r}, \xi = \frac{L + rR_tC}{2\sqrt{(r + R_t)R_tLC}}, \text{ and } \omega_n = \sqrt{\frac{r + R_t}{R_tLC}},$$

$$V_{out} = k \times V_{in}$$

α is a direct current attenuation coefficient, ξ is a coil damping matching coefficient, $\omega_n$ is a non-damping natural attenuation frequency, ω is a circular frequency, $R_t$ is a matching resistance, r is an internal resistance, L is an inductance, C is a capacitance, and k is a gain; let the distortion degree of the amplitude and the distortion degree of the phase be respectively equal to zero, to obtain an amplitude zero error damping matching coefficient and a phase zero error damping matching coefficient; a damping coefficient is determined based on the amplitude zero error damping matching coefficient and the phase zero error damping matching coefficient; and a matching resistance control value is generated by inverse calculation of the damping coefficient. Preferably, that the damping coefficient is determined based on the amplitude zero error damping matching coefficient and the phase zero error damping matching coefficient includes: the amplitude zero error damping matching coefficient and the phase zero error damping matching coefficient are averaged, and an average value is used as the damping coefficient.

Preferably, that the programmable resistor adjusts and outputs the matching damping resistance value after receiving the control signal transmitted through the serial bus and multiple iterations are performed to obtain the damping coefficient includes:

the damping adjustment microcontroller transmits the matching resistance control value to the programmable resistor through a serial bus, the serial bus digitally communicating with the programmable resistor through a serial data line and a serial clock signal line; and using a damping coefficient formula, the amplitude and the phase have nearly zero errors after iteration.

Preferably, the programmable resistor includes: an up-down counter, a decoding circuit, a saving and restoration control circuit, and a nonvolatile memory; where n resistances with same or different resistance values are connected in series between a high voltage terminal and a low voltage terminal of a digital potentiometer, two ends of each resistance are connected via an analog switch composed of CMOS tubes to serve as a tap for the digital potentiometer, one analog switch is closed each time under the control of digital signals, and a node of the resistances connected in series is thereby connected to a sliding terminal to control a matching resistance value.

Preferably, the amplifying circuit is a broadband constant gain amplifier connected in parallel with an adaptive damping matching module, an output of the amplifying circuit is controlled by an output switch to serve as a sensor output signal, and a relationship between an output voltage $V_{out}$ and an input voltage $V_{in}$ is shown in an equation below:

$$V_{out} = k \times V_{in}$$

where k is a gain.

The sensor according to claim 6 is characterized in that the damping adjustment microcontroller sends a control signal to shift the output switch to an open state when the amplitude and phase of the transfer function have zero errors, and to a closed state during matching damping resistance adjustment.

Compared with the prior art, the present disclosure has beneficial effects below.

In a near-source electromagnetic observation mode, an intended observation signal bandwidth is greater than that in a traditional far-source mode. Therefore, when a traditional sensor with only a single damping value is used for different exploration scenes under this condition, early signals are prone to oscillations. For this problem, the adaptive damping matching resistance circuit in the adaptive damping magnetic sensor according to the present disclosure carries out automatic matching control on a damping resistance value, thereby ensuring that the sensor can stably and reliably implement fine observation of an earth response under near-source, broadband and complex scene conditions.

DETAILED DESCRIPTION OF THE INVENTION

To make the objectives, technical solutions and beneficial effects of the present disclosure clearer, embodiments of the present disclosure are described with reference to the accompanying drawings hereinafter. It should be noted that the embodiments in this application and the characteristics in the embodiments may be arbitrarily combined with each other, provided that there is no conflict.

Figure 4:
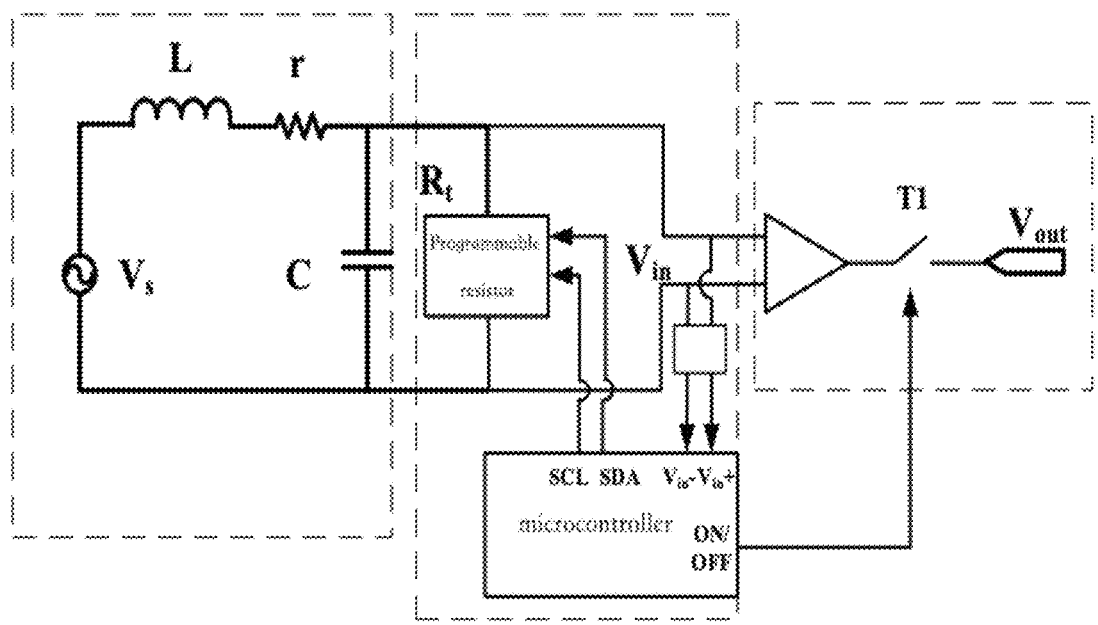
FIG. 4 is a schematic diagram of an adaptive damping magnetic field sensor according to an embodiment of the present disclosure.

As shown in FIG. 4, an embodiment of the present disclosure provides an adaptive damping magnetic field sensor, including:

a receiving coil, an adaptive damping matching resistance circuit, and an amplifying circuit; where the receiving coil is used for receiving an earth response signal generated by the earth under excitation of an emission source, and generating an induced voltage;

the adaptive damping matching resistance circuit is used for receiving the induced voltage generated by the receiving coil and automatically matching a damping resistance value to obtain a near-source broadband observation signal; and the amplifying circuit is used for amplifying the observation signal with a constant gain and outputting a sensor output signal.

The adaptive damping magnetic field sensor according to this embodiment of the present disclosure collects a response voltage according to the principles of electromagnetic induction. A coil induced signal passes through the receiving coil to generate an induced voltage. The induced voltage is input to the adaptive damping matching resistance circuit to provide accurate automatic matching for a matching resistance value, thereby obtaining a reliable observation signal. The observation signal is amplified by the amplifying circuit to achieve constant gain amplification. The amplified signal is finally used as a sensor output signal that is then collected and stored by a back-end receiver. A damping coefficient can be determined in an adaptive manner, thereby achieving fine observation for a near-source magnetic field with high bandwidth and high stability.

In an embodiment of the present disclosure, the adaptive damping matching resistance circuit includes: a damping feedback circuit, a damping adjustment microcontroller, and a programmable resistor; where the damping feedback circuit collects an input voltage of an amplifying circuit, a feedback signal that is output is connected to the damping adjustment microcontroller, the feedback signal is adjusted by the damping adjustment microcontroller to form a control signal of the programmable resistor, an output of the damping adjustment microcontroller transmits the control signal to the programmable resistor through a serial bus, the programmable resistor adjusts and outputs a matching damping resistance value after receiving the control signal transmitted through the serial bus, and multiple iterations are performed to obtain a damping coefficient.

In an embodiment of the present disclosure, the adaptive damping matching resistance circuit is configured to accurately and automatically match a damping resistance value so as to obtain a more reliable near-source broadband observation signal. The adaptive damping matching resistance circuit includes: a damping feedback circuit, a damping adjustment microcontroller, and a programmable resistor; where an input of the damping feedback circuit is an input voltage of an amplifying circuit, an output of the damping feedback circuit is connected to an input of the damping adjustment microcontroller, a feedback signal is adjusted by the microcontroller to form a control signal of the programmable resistor, an output of the damping adjustment microcontroller transmits the control signal to the programmable resistor through a serial bus, the programmable resistor adjusts and outputs a matching damping resistance value after receiving the control signal transmitted through the serial bus, and continuous iterations are performed to obtain a suitable damping coefficient.

In an embodiment of the present disclosure, the receiving coil includes: an equivalent inductance, a coil internal resistance, and a distributed capacitance; where the equivalent inductance, the coil internal resistance, the distributed capacitance, and a response voltage of the receiving coil are connected in series, an induced voltage output by the receiving coil is a voltage at both ends of the equivalent inductance, and the equivalent capacitance is connected with an adaptive damping matching resistance circuit in parallel.

In an embodiment of the present disclosure, a receiving coil network is configured to receive a response signal of the earth and generate an induced voltage signal. The receiving coil includes: an equivalent inductance, a coil internal resistance, and a distributed capacitance; where the equivalent inductance, the coil internal resistance, the distributed capacitance, and a response voltage of the receiving coil are connected in series, an induced voltage output by the receiving coil is a voltage at both ends of the equivalent inductance, and the equivalent capacitance is connected with an adaptive damping matching resistance circuit in parallel.

In an embodiment of the present disclosure, that the feedback signal is adjusted by the damping adjustment microcontroller to form the control signal of the programmable resistor includes: the damping adjustment microcontroller analyzes characteristics of the feedback signal, and uses a deviation from a linear time invariant condition to an amplitude and phase of a transfer function in formulas below as a linear error quantization function, to analyze a distortion degree of the amplitude and a distortion degree of the phase;

$$error_A(\omega) = \frac{A(\omega) - A(\omega)_{\omega \to 0}}{A(\omega)_{\omega \to 0}} = \frac{\omega_n^2}{\sqrt{(\omega_n^2 - \omega^2)^2 + (2\xi\omega_n\omega)}} - 1$$

$$error_\phi(\omega) = \phi(\omega) - \phi(\omega)_{\omega \to 0} = -\arctan\frac{2\xi\omega_n\omega}{\omega_n^2 - \omega^2} + 2\xi\frac{\omega}{\omega_n}$$

where $$\alpha = \frac{R_t}{R_t + r}, \xi = \frac{L + rR_tC}{2\sqrt{(r + R_t)R_tLC}}, \text{ and } \omega_n = \sqrt{\frac{r + R_t}{R_tLC}},$$
$$V_{out} = k \times V_{in}$$

α is a direct current attenuation coefficient, ξ is a coil damping matching coefficient, $\omega_n$ is a non-damping natural attenuation frequency, ω is a circular frequency, $R_t$ is a matching resistance, r is an internal resistance, L is an inductance, C is a capacitance, and k is a gain; let the distortion degree of the amplitude and the distortion degree of the phase be respectively equal to zero, to obtain an amplitude zero error damping matching coefficient and a phase zero error damping matching coefficient; a damping coefficient is determined based on the amplitude zero error damping matching coefficient and the phase zero error damping matching coefficient; and a matching resistance control value is generated by inverse calculation of the damping coefficient.

In an embodiment of the present disclosure, a basic principle of an adjustment process of the adaptive damping matching module is as follows. A damping feedback circuit collects an input voltage of an amplifying circuit; the input voltage is amplified and filtered by the damping feedback circuit; a filtered voltage is input to the damping adjustment microcontroller MCU; early characteristics of data are analyzed in the damping adjustment microcontroller MCU; and a deviation from a linear time invariant condition to an amplitude and phase in formulas below is used as a linear error quantization function to analyze and calculate distortion degrees of the amplitude and phase;

$$error_A(\omega) = \frac{A(\omega) - A(\omega)_{\omega \to 0}}{A(\omega)_{\omega \to 0}} = \frac{\omega_n^2}{\sqrt{(\omega_n^2 - \omega^2)^2 + (2\xi\omega_n\omega)}} - 1 \qquad (1)$$

-continued
$$error_\phi(\omega) = \phi(\omega) - \phi(\omega)_{\omega \to 0} = -\arctan\frac{2\xi\omega_n\omega}{\omega_n^2 - \omega^2} + 2\xi\frac{\omega}{\omega_n} \quad (2)$$

where $$\alpha = \frac{R_t}{R_t + r}, \xi = \frac{L + rR_tC}{2\sqrt{(r + R_t)R_tLC}}, \text{ and } \omega_n = \sqrt{\frac{r + R_t}{R_tLC}},$$

α is a direct current attenuation coefficient, ξ is a coil damping matching coefficient, and $\omega_n$ is a non-damping natural attenuation frequency.

An amplitude zero error damping matching coefficient can be obtained by letting formula (1) be equal to zero;

A phase zero error damping matching coefficient can be obtained by letting formula (2) be equal to zero; and A final damping coefficient can be obtained by averaging the amplitude zero error damping matching coefficient and the phase zero error damping matching coefficient.

In an embodiment of the present disclosure, that the damping coefficient is determined based on the amplitude zero error damping matching coefficient and the phase zero error damping matching coefficient includes: the amplitude zero error damping matching coefficient and the phase zero error damping matching coefficient are averaged, and an average value is used as the damping coefficient. In an embodiment of the present disclosure, that the programmable resistor adjusts and outputs the matching damping resistance value after receiving the control signal transmitted through the serial bus and multiple iterations are performed to obtain the damping coefficient includes:

the damping adjustment microcontroller transmits a matching resistance control value to the programmable resistor through the serial bus, the serial bus digitally communicating with the programmable resistor through a serial data line and a serial clock signal line; and using a damping coefficient formula, an amplitude and a phase have nearly zero errors.

In this embodiment of the present disclosure, the required matching resistance control value is generated by inverse calculation of the damping coefficient.

The damping adjustment microcontroller MCU transmits the matching resistance control value to the programmable resistor through the serial bus, and generates an analog output that matches the control value. The damping coefficient formula is a monotonic function that may achieve nearly zero errors of the amplitude and the phase through multiple iterations to adaptively adjust a damping resistance, thereby reliably and stably collecting a corresponding bandwidth magnetic field signal. In an embodiment of the present disclosure, the programmable resistor includes: an up-down counter, a decoding circuit, a saving and restoration control circuit, and a nonvolatile memory; where n resistances with same or different resistance values are connected in series between a high voltage terminal and a low voltage terminal of a digital potentiometer, two ends of each resistance are connected via an analog switch composed of CMOS tubes to serve as a tap for the digital potentiometer, one analog switch is closed each time under the control of digital signals, and a node of the resistances connected in series is thereby connected to a sliding terminal to control a matching resistance value.

The amplifying circuit is a broadband constant gain amplifier connected in parallel with an adaptive damping matching module, an output of the amplifying circuit is controlled by an output switch to serve as a sensor output signal, and a relationship between an output voltage $V_{out}$ and an input voltage $V_{in}$ is shown in an equation below:

$$V_{out} = k \times V_{in}$$

where k is a gain.

In an embodiment of the present disclosure, the damping adjustment microcontroller sends a control signal to shift the output switch to an open state when the amplitude and phase of the transfer function have zero errors, and to a closed state during matching damping resistance adjustment. In an embodiment of the present disclosure, the amplifying circuit is a broadband constant gain amplifier connected in parallel with an adaptive damping matching module, and an output of the amplifier is connected with an output switch in series. After passing through a receiving coil and an adaptive damping matching resistance circuit, a coil induced signal is amplified by the amplifying circuit. An output of the amplifying circuit is controlled by the output switch to finally serve as a sensor output signal.

A microcontroller sends a control signal to shift the output switch to an open state when an amplitude and phase of a transfer function have nearly zero errors, and to a closed state during matching damping resistance adjustment.

EXAMPLE

In the case of a traditional far-source method, an observation signal bandwidth itself is narrow, and a sensor resonant frequency is generally set to about 20 kHz. On the one hand, it can be fully ensured that a response curve has a good linearity below 10 kHz, and on the other hand, it is convenient to obtain a lower noise level. On such basis, a damping coefficient is generally set between 0.71-0.86 to take into account both early sensitivity and stability of the response curve.

For the near-source observation described in this disclosure, to ensure that the response curve has a good linearity within 40 kHz, a resonant frequency of a magnetic field sensor generally needs to be set above 60 kHz, which leads to significant changes in an impedance among electronic parameters of the sensor, especially a capacitance, within a whole bandwidth range. It is already difficult to take into account a low noise level, while a large observation bandwidth means that an early response curve is more affected by a shallow resistivity. An applicable range for a single damping coefficient of a traditional magnetic field sensor is smaller. Strong oscillations are more likely to occur in an early stage of a signal.

Figure 1:
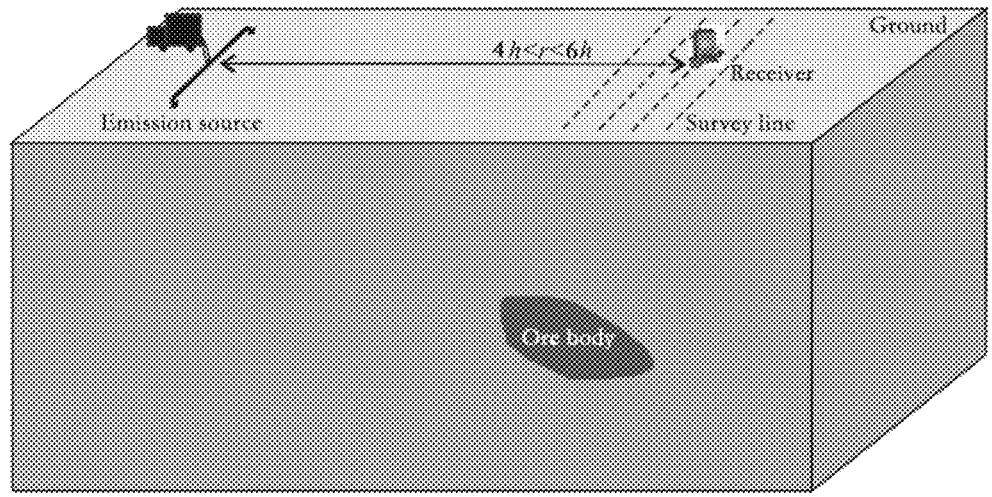
FIG. 1 is a schematic diagram of an electromagnetic survey method in a related art.
Figure 2:
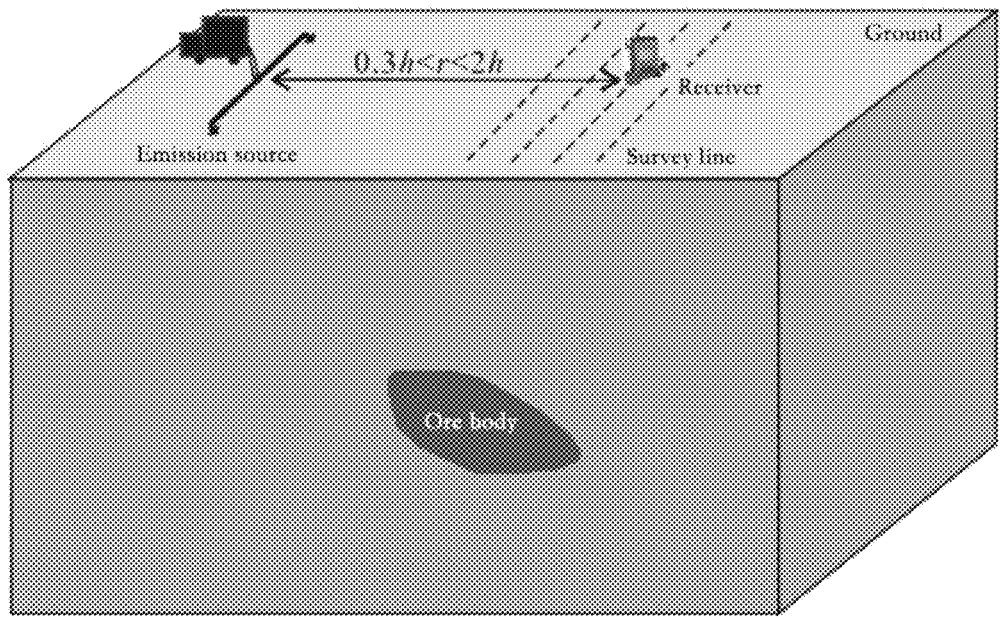
FIG. 2 is a schematic diagram of a method based on a near-source observation mode in the related art.
Figure 3:
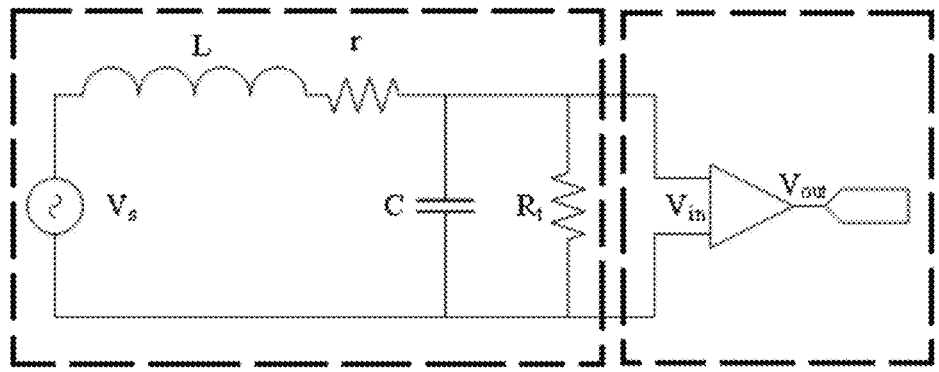
FIG. 3 is a schematic diagram of an equivalent circuit of an inductive magnetic field sensor in the related art.

To meet the demand of the near-source observation for a magnetic field sensor, the present disclosure provides an adaptive damping magnetic field sensor (as shown in FIG. 4), which is applied to response voltage acquisition for geophysical near-source electromagnetic prospecting. A coil induced signal passes through a receiving coil and an adaptive damping matching impedance network, is amplified by an amplifying circuit, and finally used as an output signal of the sensor. The adaptive damping magnetic field sensor is characterized in that the electromagnetic sensor for the near-source observation includes: a receiving coil module, an adaptive damping matching module, and an amplifying circuit. An equivalent circuit diagram is shown in FIG. 2.

In the adaptive damping magnetic field sensor, a receiving coil network is configured to receive a response signal of the earth and generate an induced voltage signal. The receiving coil includes: an equivalent inductance, a coil internal resistance, and a distributed capacitance; where the equivalent inductance, the coil internal resistance, the distributed capacitance, and a response voltage of the receiving coil are connected in series, an induced voltage output by the receiving coil is a voltage at both ends of the equivalent inductance, and the equivalent capacitance is connected with the adaptive damping matching module in parallel.

Figure 5:
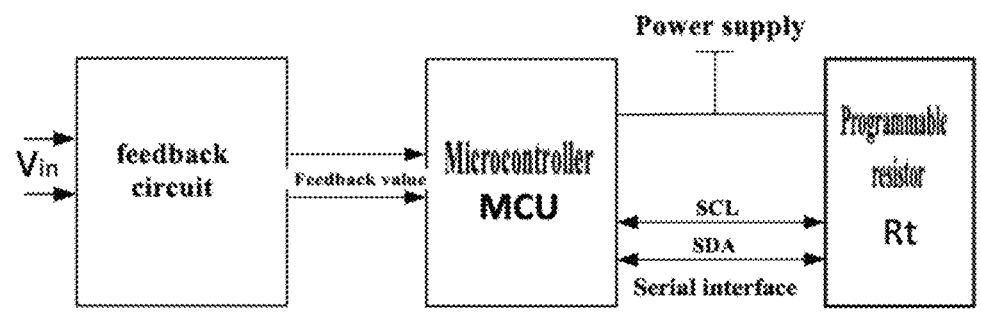
FIG. 5 is a schematic diagram of an adaptive damping matching resistance circuit according to an embodiment of the present disclosure.

Through an automatic control method, the adaptive damping technology introduces a feedback modulation based on actual conditions and a real-time programmable high-precision logic circuit to accurately match a resistance value, thereby obtaining a more reliable near-source observation signal. A specific circuit principle is shown in FIG. 5.

An adaptive damping module mainly includes a damping feedback circuit, a damping adjustment microcontroller (MCU), and a programmable resistor, and has a basic principle below. The damping feedback circuit collects an input voltage $V_{in}$ of the amplifying circuit; the input voltage is amplified and filtered by the damping feedback circuit; a feedback value is input to the damping adjustment microcontroller MCU; early characteristics of data are analyzed in the damping adjustment microcontroller MCU; and a deviation from a linear time-invariant condition to an amplitude and phase of a transfer function in formulas below is used as a linear error quantization function to analyze and calculate distortion degrees of the amplitude and phase;

$$error_A(\omega) = \frac{A(\omega) - A(\omega)_{\omega \to 0}}{A(\omega)_{\omega \to 0}} = \frac{\omega_n^2}{\sqrt{(\omega_n^2 - \omega^2)^2 + (2\xi\omega_n\omega)}} - 1$$

$$error_\phi(\omega) = \phi(\omega) - \phi(\omega)_{\omega \to 0} = -\arctan\frac{2\xi\omega_n\omega}{\omega_n^2 - \omega^2} + 2\xi\frac{\omega}{\omega_n}$$

where $$\alpha = \frac{R_t}{R_t + r}, \xi = \frac{L + rR_tC}{2\sqrt{(r + R_t)R_tLC}}, \text{ and } \omega_n = \sqrt{\frac{r + R_t}{R_tLC}},$$
$$V_{out} = k \times V_{in}$$

α is a direct current attenuation coefficient, ξ is a coil damping matching coefficient, and $\omega_n$ is a non-damping natural attenuation frequency.

An amplitude zero error damping matching coefficient and a phase zero error damping matching coefficient can be obtained by letting the above formulas be equal to zero, and a final damping coefficient can be obtained by averaging the two damping coefficients. A required matching resistance control value is generated by inverse calculation of the damping coefficient.

The damping adjustment microcontroller MCU transmits the matching resistance control value to the programmable resistor through a serial bus, and the serial bus may digitally communicate with the programmable resistor through a serial data (SDA) line and a serial clock (SCL) signal line. The damping coefficient formula is a monotonic function that may achieve nearly zero errors of an amplitude and a phase through multiple iterations.

Under the control of the matching resistance control value output by the microcontroller, the programmable resistor generates an analog output that matches the control value to adaptively adjust a damping resistance, thereby reliably and stably collecting a corresponding bandwidth magnetic field signal.

To achieve the above functionality, the programmable resistor is a key device among them. The programmable resistor is a novel CMOS integrated circuit for digital-analog mixed signal processing that replaces a traditional mechanical potentiometer (an analog potentiometer), where the digital potentiometer is controlled by a digital input to generate an analog output. The digital potentiometer adjusts a resistance value in a digital control manner, making it possible for adaptive damping matching of resistances.

Figure 6:
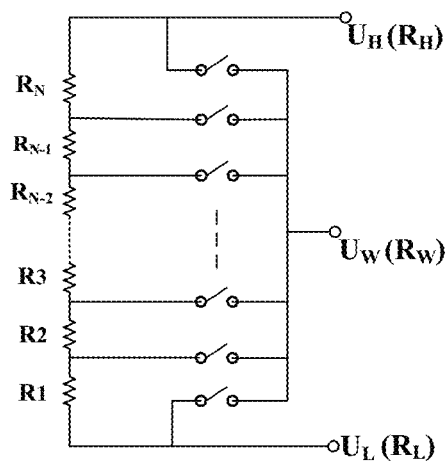
FIG. 6 is a schematic diagram of a programmable resistor according to an embodiment of the present disclosure.

A simplified circuit of the programmable resistor is shown in FIG. 6, which is an integrated three-terminal variable resistance device. When the digital potentiometer is used as a voltage divider, voltages of a high terminal, low terminal and sliding terminal thereof are represented by $U_H$, $U_L$, and $U_W$, respectively. When the digital potentiometer is used as a variable resistor, resistances of the high terminal, low terminal and sliding terminal thereof are represented by $R_X$, $R_L$, and $R_W$, respectively. A digital control part of the programmable resistor includes four circuit modules: an up-down counter, a decoding circuit, a saving and restoration control circuit, and a nonvolatile memory. A process of the digital control part to finely adjust a resistance is as follows. N resistances with same or different resistance values are connected in series between terminal $U_H$ and terminal $U_L$, two ends of each resistance are connected via an analog switch composed of CMOS tubes to serve as a tap for the digital potentiometer, one analog switch is closed each time under the control of digital signals, and a node of the resistances connected in series is thereby connected to a sliding terminal to accurately control a matching resistance value.

In the adaptive damping magnetic field sensor, the amplifying circuit is a broadband constant gain amplifier connected in parallel with an adaptive damping matching module. After passing through the receiving coil and the adaptive damping matching resistance module, a coil induced signal is amplified by the amplifying circuit. An output of the amplifying circuit is controlled by an output switch to finally serve as a sensor output signal. A relationship between an output voltage $V_{out}$ and an input voltage $V_{in}$ is shown in an equation below.

$$V_{out} = k \times V_{in}$$

The microcontroller sends a control signal to shift the output switch to an open state when the amplitude and phase of the transfer function have nearly zero errors, and to a closed state during matching damping resistance adjustment.

Although the implementations disclosed in the present disclosure are as above, their contents are only the implementations used to facilitate understanding of the technical solutions of the present disclosure, and are not intended to limit the present disclosure. Any person skilled in the technical field of the present disclosure can make any modifications and changes in the implementation form and details without departing from the core technical solution disclosed in the present disclosure. However, the protection scope defined by the present disclosure shall still be subject to the scope defined by the appended claims.

The invention claimed is:

1. An adaptive damping magnetic field sensor, comprising:
   a receiving coil, an adaptive damping matching resistance circuit, and an amplifying circuit;
   wherein the receiving coil is used for receiving an earth response signal generated by the earth under excitation of an emission source, and generating an induced voltage; the adaptive damping matching resistance circuit is used for receiving the induced voltage generated by the receiving coil and automatically matching a damping resistance value to obtain a near-source broadband observation signal; and the amplifying circuit is used for amplifying the observation signal with a constant gain and outputting a sensor output signal; the adaptive damping matching resistance circuit comprises: a damping feedback circuit, a damping adjustment microcontroller, and a programmable resistor; wherein the damping feedback circuit collects an input voltage of the amplifying circuit, the feedback signal outputted by the damping feedback circuit is connected to the damping adjustment microcontroller, the feedback signal is adjusted by the damping adjustment microcontroller to form a control signal of the programmable resistor, an output of the damping adjustment microcontroller transmits the control signal to the programmable resistor through a serial bus, the programmable resistor adjusts and outputs a matching damping resistance value after receiving the control signal transmitted through the serial bus, and multiple iterations are performed to obtain a damping coefficient; the feedback signal is adjusted by the damping adjustment microcontroller to form the control signal of the programmable resistor comprises: the damping adjustment microcontroller analyzes characteristics of the feedback signal, and uses a deviation from a linear time-invariant condition to an amplitude and phase of a transfer function in formulas below as a linear error quantization function, to analyze a distortion degree of the amplitude and a distortion degree of the phase;

$$error_A(\omega) = \frac{A(\omega) - A(\omega)_{\omega \to 0}}{A(\omega)_{\omega \to 0}} = \frac{\omega_n^2}{\sqrt{(\omega_n^2 - \omega^2)^2 + (2\xi\omega_n\omega)}} - 1$$

$$error_\phi(\omega) = \phi(\omega) - \phi(\omega)_{\omega \to 0} = -\arctan\frac{2\xi\omega_n\omega}{\omega_n^2 - \omega^2} + 2\xi\frac{\omega}{\omega_n}$$

whew $$\alpha = \frac{R_t}{R_t + r}, \xi = \frac{L + rR_tC}{2\sqrt{(r + R_t)R_tLC}}, \text{ and } \omega_n = \sqrt{\frac{r + R_t}{R_tLC}},$$
$$V_{out} = k \times V_{in}$$

α is a direct current attenuation coefficient, ξ is a coil damping matching coefficient, $\omega_n$ is a non-damping natural attenuation frequency, ω is a circular frequency, $R_t$ is a matching resistance, r is an internal resistance, L is an inductance, C is a capacitance, and k is a gain; let the distortion degree of the amplitude and the distortion degree of the phase be respectively equal to zero, to obtain an amplitude zero error damping matching coefficient and a phase zero error damping matching coefficient; a damping coefficient is determined based on the amplitude zero error damping matching coefficient and the phase zero error damping matching coefficient; and a matching resistance control value is generated by inverse calculation of the damping coefficient; the damping coefficient is determined based on the amplitude zero error damping matching coefficient and the phase zero error damping matching coefficient comprises: the amplitude zero error damping matching coefficient and the phase zero error damping matching coefficient are averaged, and an average value is used as the damping coefficient.

2. The sensor according to claim 1, wherein the receiving coil comprises: an equivalent inductance, a coil internal resistance, and a distributed capacitance; wherein the equivalent inductance, the coil internal resistance, the distributed capacitance, and a response voltage of the receiving coil are connected in series, the induced voltage output by the receiving coil is a voltage at both ends of the equivalent inductance, and the equivalent capacitance is connected with the adaptive damping matching resistance circuit in parallel.

3. The sensor according to claim 1, wherein that the programmable resistor adjusts and outputs the matching damping resistance value after receiving the control signal transmitted through the serial bus and multiple iterations are performed to obtain the damping coefficient comprises: the damping adjustment microcontroller transmits the matching resistance control value to the programmable resistor through the serial bus, the serial bus digitally communicating with the programmable resistor through a serial data line and a serial clock signal line; and using a damping coefficient formula, the amplitude and the phase have nearly zero errors after iteration.

4. The sensor according to claim 1, wherein the programmable resistor comprises: an up-down counter, a decoding circuit, a saving and restoration control circuit, and a nonvolatile memory; wherein n resistances with same or different resistance values are connected in series between a high voltage end and a voltage end of a digital potentiometer, two ends of each resistance are connected via an analog switch composed of CMOS (complementary metal oxide semiconductor) tubes to serve as a tap for the digital potentiometer, one analog switch is closed and opened each time under control of digital signals, and a node of the resistances connected in series is thereby connected to a sliding terminal to control a matching resistance value.

5. The sensor according to claim 1, wherein the amplifying circuit is a broadband constant gain amplifier connected in parallel with an adaptive damping matching module, an output of the amplifying circuit is controlled by an output switch to serve as a sensor output signal, and a relationship between an output voltage $V_{out}$ and an input voltage $V_{in}$ is shown in an equation below:

$$V_{out} = k \times V_{in}$$

where k is a gain.

6. The sensor according to claim 1, wherein the damping adjustment microcontroller sends a control signal to shift the output switch to an open state when the amplitude and phase of the transfer function have zero errors, and to a closed state during matching damping resistance adjustment.

* * * * *